(12) United States Patent
Choi et al.

(10) Patent No.: US 6,873,379 B2
(45) Date of Patent: Mar. 29, 2005

(54) FABRICATING METHOD OF AN ARRAY SUBSTRATE HAVING POLYSILICON THIN FILM TRANSISTOR

(75) Inventors: Jae-Sik Choi, Gyeongsangbuk-do (KR); Sang-Min Jang, Gyeongsangbuk-do (KR)

(73) Assignee: LG.Philips LCD Co., Ltd., Seoul (KR)

( * ) Notice: Subject to any disclaimer, the term of this patent is extended or adjusted under 35 U.S.C. 154(b) by 52 days.

(21) Appl. No.: 10/109,642

(22) Filed: Apr. 1, 2002

(65) Prior Publication Data

US 2002/0139983 A1 Oct. 3, 2002

(30) Foreign Application Priority Data

Mar. 30, 2001 (KR) .................................. 10-2001-17023

(51) Int. Cl.[7] .............................................. G02F 1/136
(52) U.S. Cl. ........................................ 349/43; 349/187
(58) Field of Search ............................. 349/42–43, 187; 257/72, 59

(56) References Cited

U.S. PATENT DOCUMENTS 6,465,861 B1 * 10/2002 Liu et al. .................... 257/444
6,521,913 B1 * 2/2003 Murade ......................... 257/59
2002/0115299 A1 * 8/2002 Ito et al. ...................... 438/704

* cited by examiner

*Primary Examiner*—Dung T. Nguyen
(74) *Attorney, Agent, or Firm*—McKenna Long & Aldridge LLP

(57) ABSTRACT

A fabricating method of an array substrate includes: forming a semiconductor layer of polysilicon on a substrate, the semiconductor layer having first and second regions; forming a gate insulating layer on the semiconductor layer; forming a gate electrode on the gate insulating layer on the first region of the semiconductor layer; forming source and drain regions by doping impurities into the second region of the semiconductor layer; forming an interlayer insulating layer on the gate electrode and the source and drain regions, the interlayer insulating layer having first and second contact holes exposing the source and drain regions, respectively, the first and second contact holes being formed by consecutive dry and wet etching methods; forming source and drain electrodes on the interlayer insulating layer, the source and drain electrodes contacting the source and drain regions through the first and second contact holes, respectively; forming a passivation layer on the source and drain electrodes, the passivation layer having a third contact hole exposing the drain electrode; and forming a pixel electrode on the passivation layer, the pixel electrode contacting the drain electrode through the third contact hole.

31 Claims, 6 Drawing Sheets

FABRICATING METHOD OF AN ARRAY SUBSTRATE HAVING POLYSILICON THIN FILM TRANSISTOR

This application claims the benefit of Korean Patent Application No. 2001-17023, filed on Mar. 30, 2001, which is hereby incorporated by reference as if fully set forth herein.

BACKGROUND OF THE INVENTION

1. Field of the Invention

The present invention relates to a liquid crystal display (LCD) device, and more particularly to a fabricating method of an array substrate for the LCD device having polysilicon thin film transistor (TFT).

2. Description of the Related Art

In a conventional process for forming a polysilicon layer, an intrinsic amorphous silicon layer is formed on an insulating substrate by using a plasma chemical vapor deposition (PCVD) method or a low pressure chemical vapor deposition (LPCVD) method. When the amorphous silicon layer has a thickness of about 500 Å (angstrom), it is recrystallized into a polysilicon layer by a crystallization method. The crystallization method is generally one of the following: a laser annealing method, a solid phase crystallization (SPC) method, and a metal induced crystallization (MIC) method.

In the laser annealing method, an excimer laser beam is applied to the amorphous silicon layer on an insulating substrate to form a polysilicon layer. For the SPC method, a heat-treatment is applied to the amorphous silicon layer at a high temperature for a time period sufficient to form the polysilicon layer. For the MIC method, a metal layer is deposited on the amorphous silicon layer and the deposited metal layer is used as a crystallization seed. In case of the MIC method, a large sized glass substrate may be used as the insulating substrate.

The laser annealing method has recently become a more prevalent method in forming a polysilicon layer. The laser annealing method forms an amorphous silicon layer on the insulating substrate melting the amorphous silicon layer with a laser. Then, the melted amorphous silicon layer is cooled to form a polysilicon layer.

The SPC method forms a buffer layer on a quartz substrate that can withstand temperatures higher than 600° C. (degrees Celsius). The buffer layer prevents the quartz substrate from contaminating other regions. Next, an amorphous silicon layer is deposited on the buffer layer and is heated in a furnace to a sufficient temperature to form a polysilicon layer.

The MIC method deposits a catalytic metal layer on an amorphous silicon layer which is then heated to form a polysilicon layer. The amorphous silicon layer of the MIC method is crystallized more rapidly with the catalytic metal layer than the SPC method, and the process temperature of the MIC is lower than the SPC method.

Generally, in using the polysilicon as an active layer for a coplanar type TFT, a gate electrode is formed over the active layer upon an array substrate.

FIG. 1 is a schematic cross-sectional view of an array substrate having a conventional coplanar type thin film transistor for a liquid crystal display device.

In FIG 1, a coplanar type TFT includes a semiconductor layer 8 formed on a substrate 1. The semiconductor layer 8 has a first region (the active region 14) and a second region (the source and drain regions 16 and 17). A gate electrode 12 is formed over the active region 14 and a gate insulating layer 10 is interposed therebetween. An interlayer insulating layer 18, including contact holes 16a and 17a corresponding to the source and drain regions 16 and 17, is formed on the gate electrode 12. Then, source and drain electrodes 20 and 22 are formed on the interlayer insulating layer 18, and electrically connected to the source and drain regions 16 and 17 through the contact holes 16a and 17a, respectively. A transparent pixel electrode 28 is electrically connected to the drain electrode 22 and a passivation layer 26 is interposed therebetween.

As shown in FIG. 1, the driving characteristic of the TFT is directly related to the conductivity between the source and drain regions 16 and 17, and the source and drain electrodes 20 and 22, and the drain electrode 22 and the pixel electrode 28. With the interlayer insulating layer 18 and the passivation layer 26 etched for inter-contact, the conductivity properties depend on the interlayer insulating layer 18 and the passivation layer 26, respectively. During the etching process, several problems such as low etching rate or low etching uniformity may occur.

FIGS. 2A to 2C are schematic cross-sectional views showing the fabricating processes of an array substrate having a conventional coplanar type thin film transistor.

In FIG. 2A, a first insulating layer 2 and an amorphous silicon layer are subsequently formed on a substrate 1. After crystallizing the amorphous silicon layer by a specific method to form a polysilicon layer, the polysilicon layer is patterned to form a semiconductor layer 8 in the shape of island. The first insulating layer 2 is a buffer layer which prevents alkyl radicals from substrate 1 from diffusing to the semiconductor layer 8 at a high temperature.

In FIG. 2B, a second insulating layer 10 of silicon nitride (SiNx) or silicon oxide ($SiO_2$) is formed on the semiconductor layer 8. The second insulating layer 10 is the gate insulating layer. The depositing and patterning of a conductive metallic material forms a gate layer 12 on the second insulating layer 10, at a region corresponding to an active region 14 of the semiconductor layer 8. The semiconductor layer 8 has first and second regions that form an intrinsic silicon region 14 and a doped silicon region 16 and 17, respectively. The second region 16 and 17 is located at the sides of the first region 14. The second insulating layer 10 and the gate layer 12 are formed over the first region 14 of the semiconductor layer 8. To reduce the number of masks, the second insulating layer 10 and the gate layer 12 are formed with same patterns.

After forming the gate layer 12, an ion doping process is performed on the second region 16 and 17 of the semiconductor layer 8 forming an ohmic contact layer. During the ion doping process, the gate layer 12 acts as an ion-stopper and prevents dopants from permeating into the first region 14 of the semiconductor layer 8.

In FIG. 2C, a third insulating layer 18, an interlayer insulating layer, is formed on the gate layer 12, the second region 16 and 17 of the semiconductor layer 8 and the second insulating layer 10. Next, the third insulating layer 18 is patterned to form the first and second contact holes 16a and 17a at a region corresponding to the second region 16 and 17. The third insulating layer 18 includes one of the inorganic material groups such as $SiO_2$, SiNx, TEOS or $Al_2O_3$.

Source and drain electrodes 20 and 22 are formed for connection to the second region 16 and 17 of the semiconductor layer 8 through the first and second contact holes 16a and 17a, respectively.

As shown in FIG. 1, a passivation layer 26 is deposited on the entire surface of the substrate and patterned to form a third contact hole 17b to expose a portion of the drain electrode 22. Then, a transparent layer is deposited and patterned forming a pixel electrode 28 that is electrically connected to the exposed drain electrode 22 through the third contact hole 17b.

The source and drain electrodes are connected to the impurity-doped polysilicon region through the first and second contact holes 16a and 17a formed by etching the interlayer insulating layer.

FIGS. 3 and 4 are schematic, magnified, cross-sectional views of "A" and "B" (of FIG. 1) formed by dry and wet etching methods of the interlayer insulating layer, respectively.

In FIG. 3, a photo resist (PR) is coated on the interlayer insulating layer 18 and then exposed with a mask (not shown) to form a PR pattern 30. After developing and stripping the PR, a portion of the interlayer insulating layer 18, corresponding to the second region 16 and 17 (of FIG. 2C) of the semiconductor layer, is exposed. Then, the exposed portion of the third insulating layer is etched by dry etching method to expose the second region 16 and 17, doped with n-or p-type impurities.

Since the etch rate of dry etching method is slow, the desired depth is limited. Furthermore, as the etch time increases, the PR pattern hardens and prevents the stripping away process. Therefore, with the dry etching method, the etching condition is controlled to remove the interlayer insulating layer before the PR pattern hardens. However, if the thickness of the interlayer insulating layer 18 is not uniform, a portion of the interlayer insulating layer 18 will remain so that the second region 16 and 17 is partially covered with the residual interlayer insulating layer "C". Alternatively, if the second region is exposed to the plasma, the device characteristics deteriorate because the contact resistance between the source and drain electrodes and the second region increases. Therefore, process reliability and a shorter etch time are necessary for the dry etching method of the interlayer insulating layer. For the passivation layer 28 (of FIG. 1), the same phenomenon can occur.

In FIG. 4, the interlayer insulating layer 18 is etched by wet etching method. Although a better etching profile is acquired with wet etching, it takes longer than dry etching, and a critical dimension (CD) loss may occur due to the over-etch of the interlayer insulating layer 18 at a portion "D" contacting the PR 30. Furthermore, the driving characteristic of the LCD panel can be degraded and a point defect can occur if an electrical opening between the source and drain electrodes, and the second region occurs due to a PR residue.

SUMMARY OF THE INVENTION

Accordingly, the present invention is directed to a liquid crystal display device that substantially obviates one or more of problems due to limitations and disadvantages of the related art.

An advantage of the present invention is to provide a fabricating method of an array substrate for a liquid crystal display device that includes subsequent dry and wet etching methods for etching steps of a interlayer insulating layer or a passivation layer.

Another advantage of the present invention is to improve a driving characteristic of an LCD device by improving a contact property between source and drain electrodes and a polysilicon layer, or a drain electrode and a pixel electrode.

Additional features and advantages of the invention will be set forth in the description that follows, and in part will be apparent from the description, or may be learned by practice of the invention. These and other advantages of the invention will be realized and attained by the structure particularly pointed out in the written description and claims, as well as the appended drawings.

To achieve these and other advantages and in accordance with the purpose of the present invention, as embodied and broadly described, a fabricating method of an array substrate includes: forming a semiconductor layer of polysilicon on a substrate, the semiconductor layer having first and second regions; forming a gate insulating layer on the semiconductor layer; forming a gate electrode on the gate insulating layer on the first region of the semiconductor layer; forming source and drain regions by doping impurities into the second region of the semiconductor layer; forming an interlayer insulating layer on the gate electrode and the source and drain regions, the interlayer insulating layer having first and second contact holes exposing the source and drain regions, respectively, the first and second contact holes being formed by subsequent dry and wet etching methods; forming source and drain electrodes on the interlayer insulating layer, the source and drain electrodes contacting the source and drain regions through the first and second contact holes, respectively; forming a passivation layer on the source and drain electrodes, the passivation layer having a third contact hole exposing the drain electrode; and forming a pixel electrode on the passivation layer, the pixel electrode contacting the drain electrode through the third contact hole.

In another aspect, a fabricating method of a thin film transistor includes: forming a semiconductor layer of polysilicon on a substrate, the semiconductor layer having first and second regions; forming a gate insulating layer on the semiconductor layer; forming a gate electrode on the gate insulating layer on the first region of the semiconductor layer; forming source and drain regions by doping impurities into the second region of the semiconductor layer; forming an interlayer insulating layer on the gate electrode and the source and drain regions, the interlayer insulating layer having first and second contact holes exposing the source and drain regions, the first and second contact holes being formed by subsequent dry and wet etching methods; and forming source and drain electrodes on the interlayer insulating layer, the source and drain electrodes contacting the source and drain regions through the first and second contact holes, respectively.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the illustrated embodiments of the present invention, examples of which are illustrated in the accompanying drawings. Wherever possible, similar reference numbers will be used throughout the drawings to refer to the same or like parts.

FIG. 5A to 5E are schematic cross-sectional views showing fabricating processes of an array substrate according to an embodiment of the present invention. (Since fabricating processes of the present invention for a buffer layer 102 and a semiconductor layer 108 of polysilicon are the same as those of the conventional art, the illustrations will be omitted.)

Figure 1:
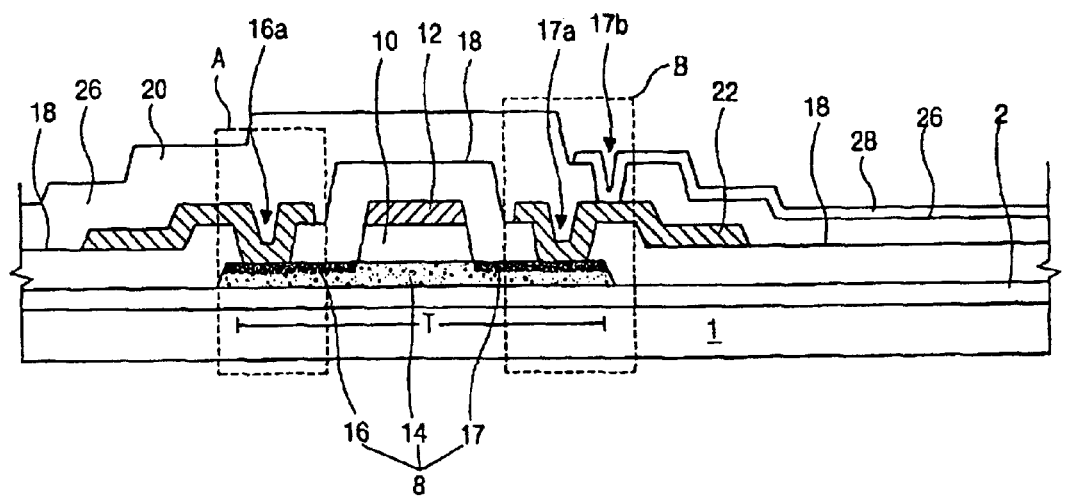
FIG. 1 is a schematic cross-sectional view of an array substrate having a conventional coplanar type thin film transistor for a liquid crystal display device.
Figure 2A:
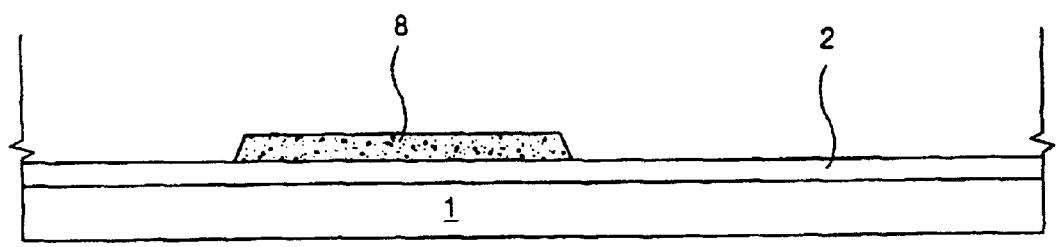
FIGS. 2A to 2C are schematic cross-sectional views showing fabricating processes of an array substrate having a conventional coplanar type thin film transistor.
Figure 2B:
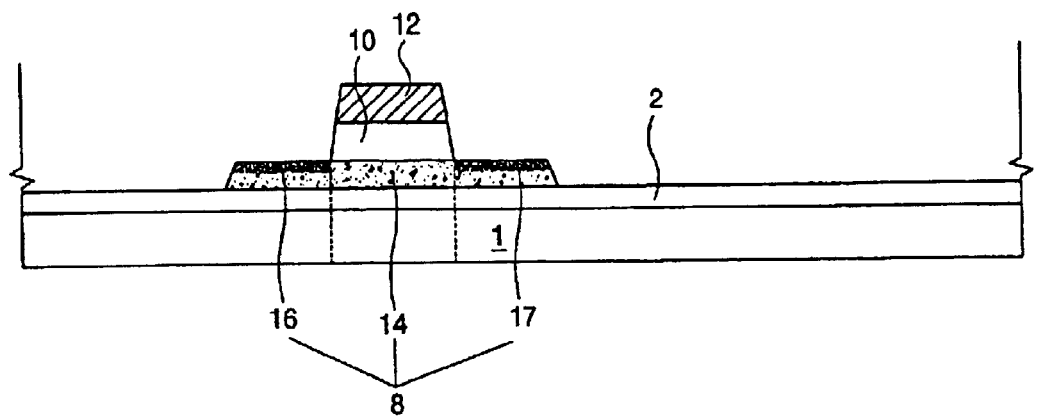
Figure 2C:
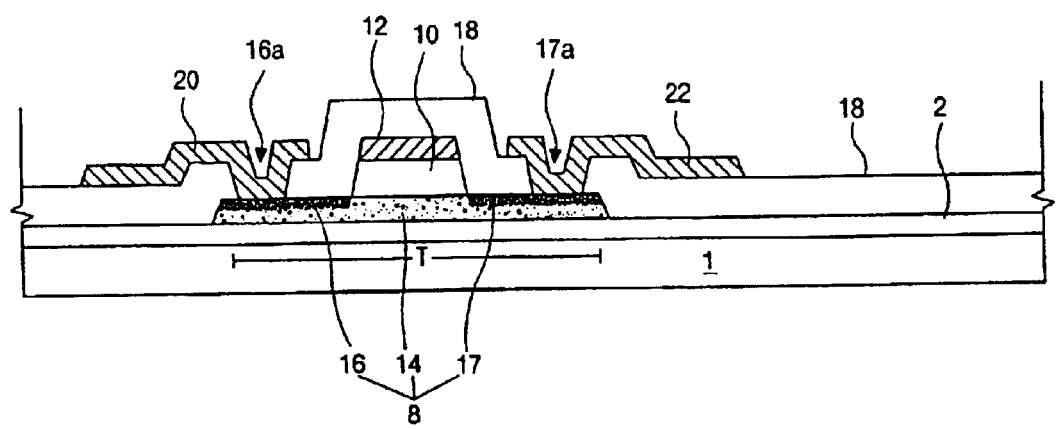
Figure 3:
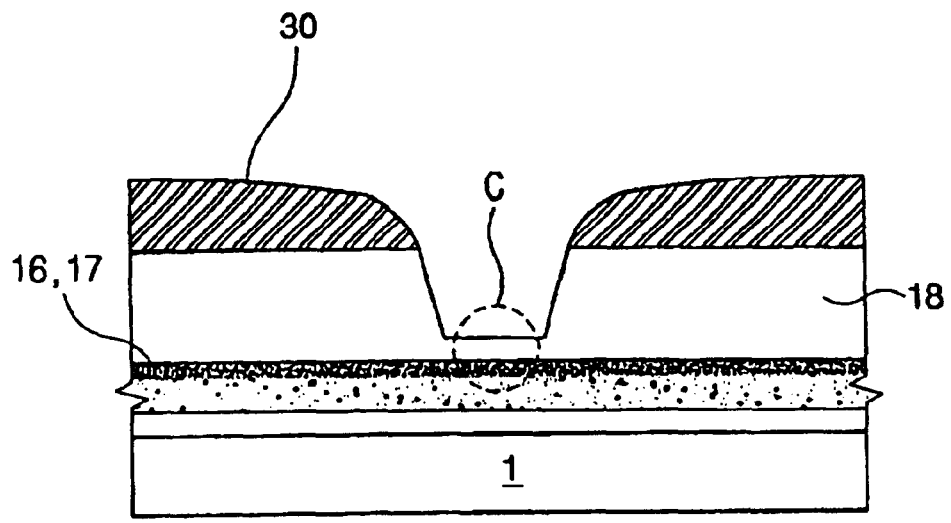
FIGS. 3 and 4 are schematic magnified cross-sectional views of "A" or "B" (of FIG. 1) formed by dry and wet etching methods for the interlayer insulating layer, respectively.
Figure 4:
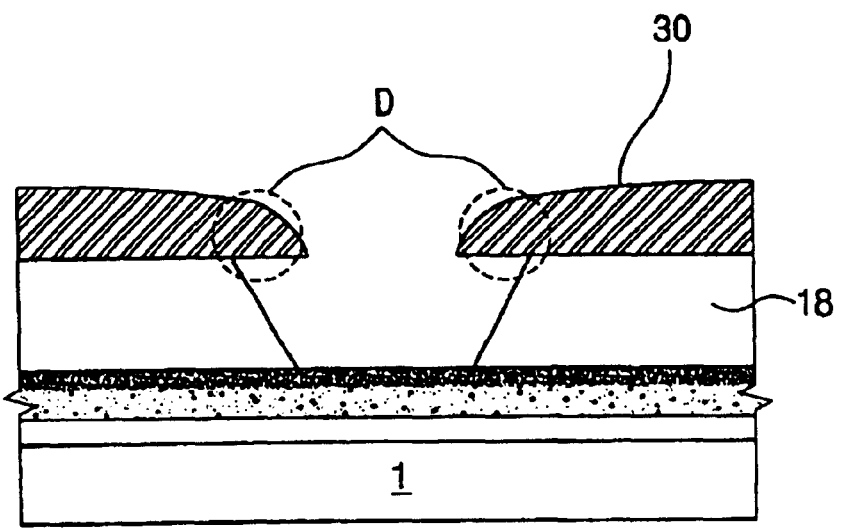
Figure 5A:
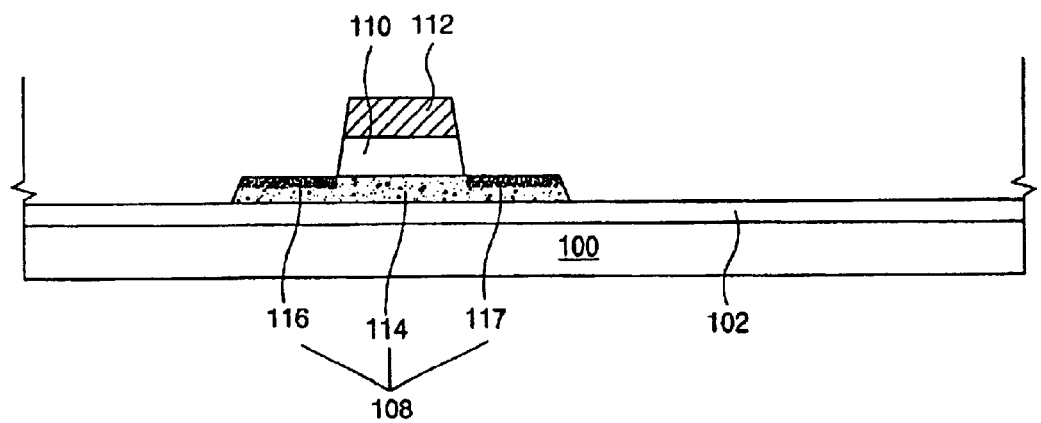
FIG. 5A to 5E are schematic cross-sectional views showing fabricating processes of an array substrate according to an embodiment of the present invention.

As shown in FIG. 5A, a gate insulating layer 110 and a gate electrode 112 are formed on the semiconductor layer 108 that has a first region 114 of intrinsic silicon and a second region 116 and 117 of impurity-doped silicon. The second region 116 and 117 is disposed on both sides of the first region 114. The gate insulating layer 110 and the gate electrode 112, on the first region 114, are formed with one photo mask to reduce the number of photo masks.

After forming the gate electrode 112, the second region 116 and 117 for ohmic contact are doped with impurities. The gate electrode 112 acts as an ion-stopper preventing the impurities from penetrating into the first region 114. The electrical characteristics of the semiconductor layer 108 depend on the type of the impurities used for the specific TFT application. For example, a p-type TFT is formed using the impurities of element Group III such as boron (B) and a n-type TFT is formed using the impurities of element Group V such as phosphorus (P). After doping, the impurity-doped elements are activated.

Figure 5B:
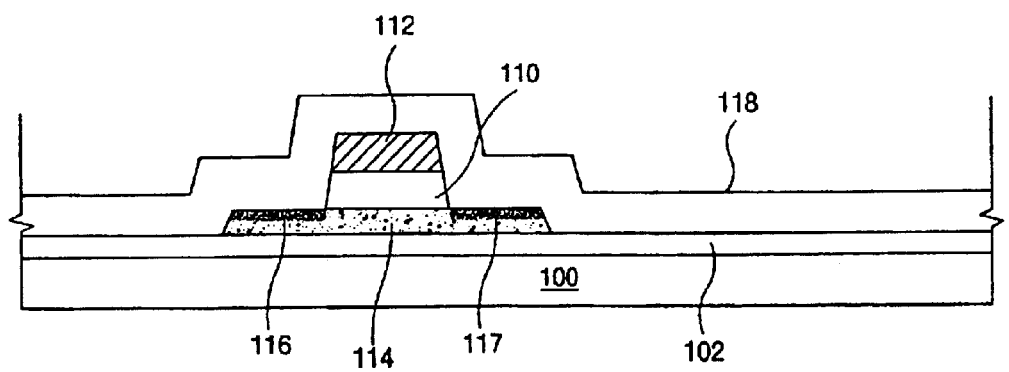

As shown in FIG. 5B, an interlayer insulating layer 118 is formed on the gate electrode 112, the second region 116 and 117, and the buffer layer 102.

Figure 5C:
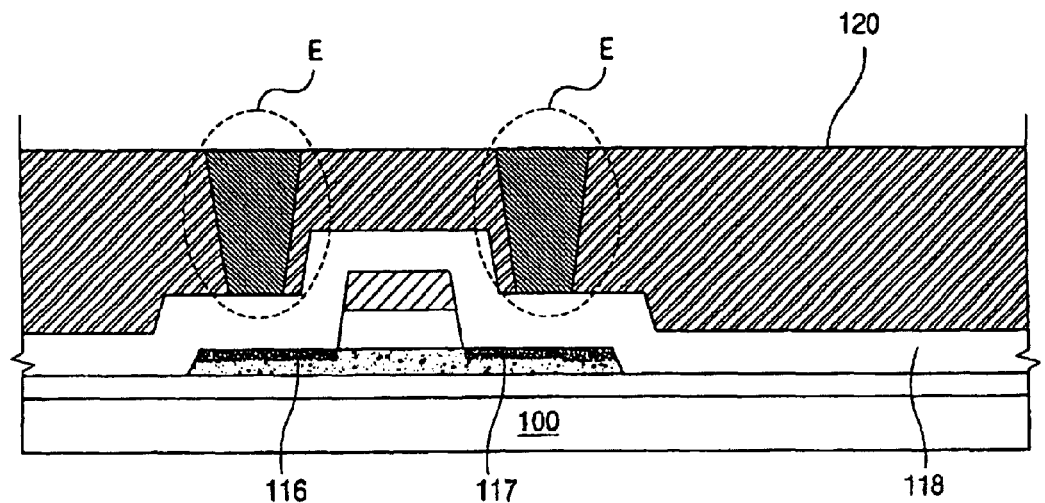

As shown in FIG. 5C, a photo resist (PR) layer 120 is formed on the interlayer insulating layer 118 for a photo lithography process. Then, an exposing process is performed, in which a specific region "E," corresponding to the second region 116 and 117, is exposed to light with a photo mask (not shown) over the PR layer 120.

Figure 5D:
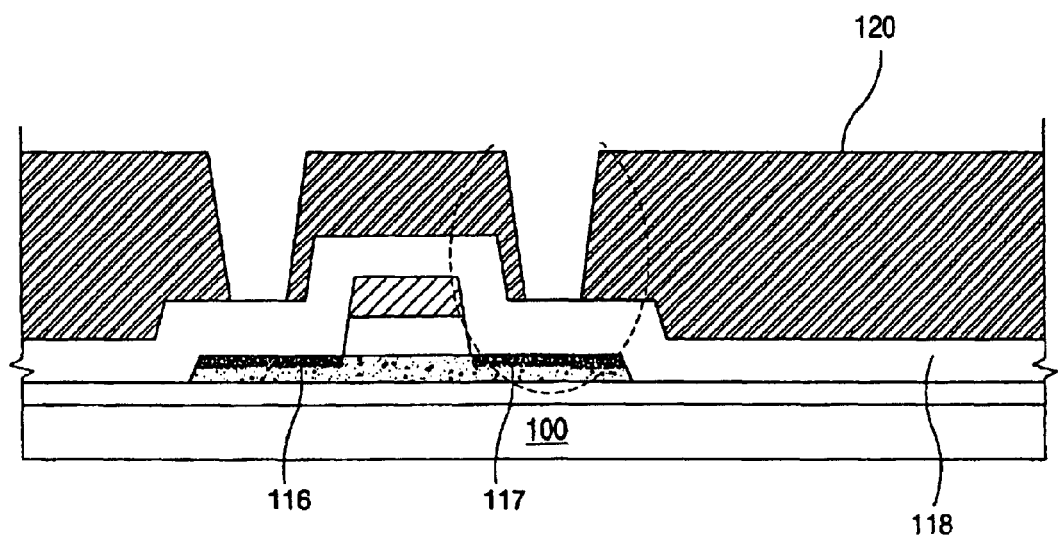

As shown in FIG. 5D, the exposed PR layer 120 is formed so that the interlayer insulating layer 118 of the specific region "E" can be exposed. After developing, the interlayer insulating layer 118 is etched by dry and wet etching methods to form first and second contact holes 116a and 117a. These etching processes will be explained in FIGS. 6A and 6B in detail.

Figure 5E:
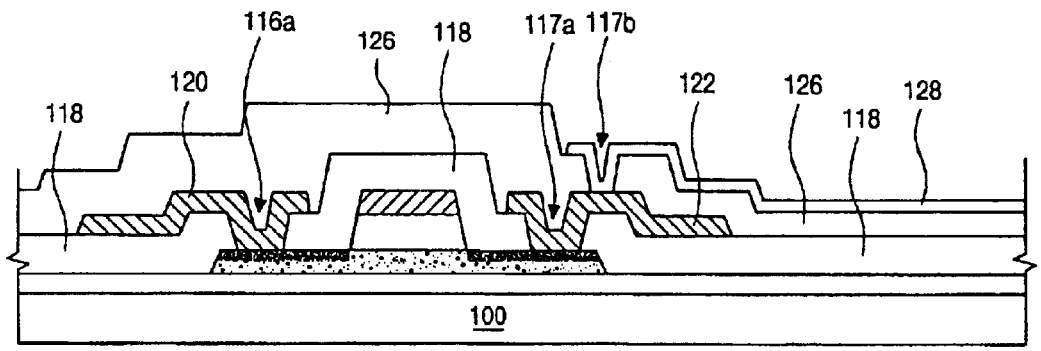

As shown in FIG. 5E, source and drain electrodes 120 and 122 are formed on the interlayer insulating layer 118. The source and drain electrodes 120 and 122 are connected to the second region 116 and 117 through the first and second contact holes 116a and 117a, respectively. The source and drain electrodes 120 and 122 are made of conductive material such as aluminum (Al), chromium (Cr), tungsten (W), molybdenum (Mo), antimony (Sb), tantalum (Ta) or aluminum alloy.

Next, a passivation layer 126 is formed on the entire surface of the substrate 100. By the same dry and wet etching processes, a third contact hole 117b, exposing the drain electrode 122, is formed. Then, a transparent pixel electrode 128 is formed on the passivation layer 126. The transparent pixel electrode 128 is connected to the drain electrode 122 through the third contact hole 117b.

Figure 6A:
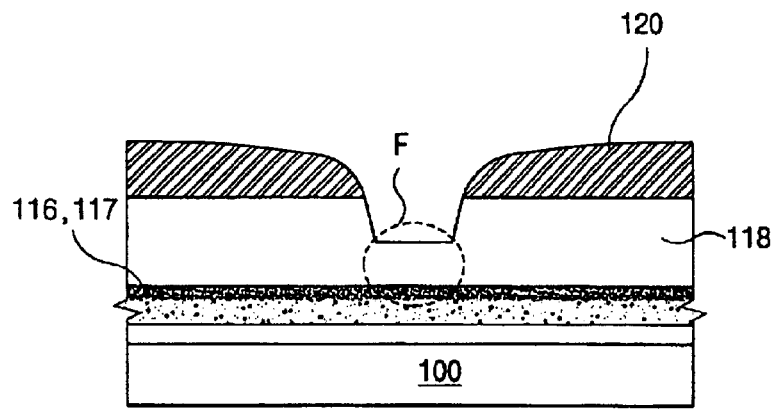
FIGS. 6A and 6B are schematic cross-sectional views showing subsequent dry and wet etching processes for first or second contact holes according to an embodiment of the present invention.
Figure 6B:
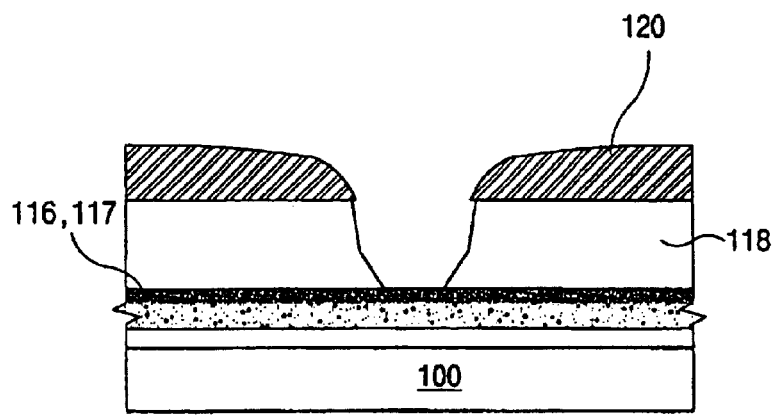

FIGS. 6A and 6B are schematic cross-sectional views showing dry and wet etching processes for first or second contact holes according to an embodiment of the present invention.

As shown in FIG. 6A, the interlayer insulating layer 118 is etched by dry etching method. In dry etching method, thin films are removed by collision of ions so that residual PR on the exposed interlayer insulating layer can be eliminated. Since the dry etching process is performed during the period before the PR layer 120 hardens, the interlayer insulating layer 118 has a residual layer "F".

The residual layer "F" is promptly etched by wet etching method so that the second region 116 and 117 of the semiconductor layer can be exposed, as shown in FIG. 6B.

Therefore, contact holes formed by consecutive a combined dry and wet etching method have improved etch uniformity and pattern resolution. Furthermore, etch profile is easily controlled.

Consequently, dry and wet etching methods have several advantages. First, since the etch rate of a consecutive combined dry and wet etching method is higher than that of dry etching method, the production yield can be improved. Second, since the etch profile of a consecutive combined dry and wet etching method is more uniform than that of wet etching method, CD loss can be reduced. Third, since all the residual PR is eliminated during the dry etching process, the contact property between the source and drain electrodes and the semiconductor layer and the operating property of the array substrate can be improved.

It will be apparent to those skilled in the art that various modifications and variation can be made in the method of manufacturing a flat pane display device of the present invention without departing from the spirit or scope of the invention. Thus, it is intended that the present invention cover the modifications and variations of this invention provided they come within the scope of the appended claims and their equivalents.

What is claimed is:

1. A fabricating method of an array substrate, comprising:
    forming a semiconductor layer of polysilicon on a substrate, the semiconductor layer having first and second regions;
    forming a gate insulating layer on the semiconductor layer;
    forming a gate electrode on the gate insulating layer on the first region of the semiconductor layer;
    forming source and drain regions by doping impurities into the second region of the semiconductor layer;
    forming an interlayer insulating layer on the gate electrode and the source and drain regions, the interlayer insulating layer having first and second contact holes exposing the source and drain regions, respectively, wherein forming the first and second contact holes further includes,
        forming a photo-resist on the interlayer insulating layer, the photo-resist having a pattern of the first and second contact holes;
        dry-etching the interlayer insulating layer before the photo-resist pattern hardens;

then, wet-etching the interlayer insulating layer so as to expose the second region of the semiconductor layer;

removing the photo-resist pattern;

forming source and drain electrodes on the interlayer insulating layer, the source and drain electrodes contacting the source and drain regions through the first and second contact holes, respectively;

forming a passivation layer on the source and drain electrodes, the passivation layer having a third contact hole exposing the drain electrode; and forming a pixel electrode on the passivation layer, the pixel electrode contacting the drain electrode through the third contact hole.

2. The method according to claim 1, wherein forming an interlayer insulating layer on the gate electrode and the source and drain regions, the interlayer insulating layer having first and second contact holes exposing the source and drain regions, respectively, the first and second contact holes being formed by subsequent dry and wet etching methods.

3. The method according to claim 1, wherein forming an interlayer insulating layer on the gate electrode and the source and drain regions, the interlayer insulating layer having first and second contact holes exposing the source and drain regions, respectively, the first and second contact holes being formed by consecutive dry and wet etching methods.

4. The method according to claim 1, wherein forming the interlayer insulating layer comprises:

forming a photo resist pattern on the interlayer insulating layer;

dry etching the interlayer insulating layer partially using the photo resist pattern as a mask; and wet etching the interlayer insulating layer fully, thereby forming the first and second contact holes exposing the source and drain electrodes, respectively.

5. The method according to claim 4, wherein forming the passivation layer comprises the same steps as forming the interlayer insulating layer.

6. The method according to claim 1, further comprising forming a buffer layer under the semiconductor layer.

7. The method according to claim 1, wherein the semiconductor layer is formed by crystallization of amorphous silicon.

8. The method according to claim 1, wherein the interlayer insulating layer and the passivation layer includes an inorganic insulating material.

9. The method according to claim 8, wherein the inorganic insulating material is one of silicon oxide ($SiO_2$), silicon nitride (SiNx), tetraethoxysilane (TEOS) and aluminum oxide ($Al_2O_3$).

10. The method according to claim 1, wherein the gate electrode includes a conductive metallic material.

11. The method according to claim 10, wherein the conductive metallic material is one of aluminum (Al), chromium (Cr), tungsten (W), molybdenum (Mo), antimony (Sb), tantalum (Ta) and aluminum alloy.

12. The method according to claim 1, wherein the source and drain electrodes include a conductive metallic material.

13. The method according to claim 12, wherein the conductive material is one of aluminum (Al), chromium (Cr), tungsten (W), molybdenum (Mo), antimony (Sb), tantalum (Ta) and aluminum alloy.

14. The method according to claim 1, wherein the third contact hole is formed by dry and wet etching methods and exposes the drain electrode.

15. A fabricating method of a thin film transistor, comprising:

forming a semiconductor layer of polysilicon on a substrate, the semiconductor layer having first and second regions;

forming a gate insulating layer on the semiconductor layer;

forming a gate electrode on the gate insulating layer on the first region of the semiconductor layer;

forming source and drain regions by doping impurities into the second region of the semiconductor layer;

forming an interlayer insulating layer on the gate electrode and the source and drain regions, the interlayer insulating layer having first and second contact holes exposing the source and drain regions, wherein forming the first and second contact holes further includes, forming a photo-resist on the interlayer insulating layer, the photo-resist having a pattern of the first and second contact holes;

dry-etching the interlayer insulating layer before the photo-resist pattern hardens;

then, wet-etching the interlayer insulating layer so as to expose the second region of the semiconductor layer;

removing the photo-resist pattern; and forming source and drain electrodes on the interlayer insulating layer, the source and drain electrodes contacting the source and drain regions through the first and second contact holes, respectively.

16. The method according to claim 15, wherein forming an interlayer insulating layer on the gate electrode and the source and drain regions, the interlayer insulating layer having first and second contact holes exposing the source and drain regions, respectively, the first and second contact holes being formed by subsequent dry and wet etching methods.

17. The method according to claim 15, wherein forming an interlayer insulating layer on the gate electrode and the source and drain regions, the interlayer insulating layer having first and second contact holes exposing the source and drain regions, respectively, the first and second contact holes being formed by consecutive dry and wet etching methods.

18. The method according to claim 15, wherein forming the interlayer insulating layer comprises:

forming a photo resist pattern on the interlayer insulating layer;

dry etching the interlayer insulating layer partially using the photo resist pattern as a mask; and wet etching the interlayer insulating layer fully, thereby forming the first and second contact holes exposing the source and drain electrodes, respectively.

19. The method according to claim 15, wherein the semiconductor layer is formed by crystallization of amorphous silicon.

20. The method according to claim 15, wherein the interlayer insulating layer and the passivation layer include an inorganic insulating material.

21. The method according to claim 20, wherein the inorganic insulating material is one of silicon oxide ($SiO_2$), silicon nitride (SiNx), tetraethoxysilane (TEOS) and aluminum oxide ($Al_2O_3$).

22. The method according to claim 15, wherein the gate electrode includes a conductive metallic material.

23. The method according to claim 22, wherein the conductive metallic material is one of aluminum (Al), chromium (Cr), tungsten (W), molybdenum (Mo), antimony (Sb), tantalum (Ta) and aluminum alloy.

24. The method according to claim 15, wherein the source and drain electrodes include a conductive metallic material.

25. The method according to claim 24, wherein the conductive metallic material is one of aluminum (Al), chromium (Cr), tungsten (W), molybdenum (Mo), antimony (Sb), tantalum (Ta) and aluminum alloy.

26. A fabricating method of an array substrate, comprising:
   forming a semiconductor layer of polysilicon on a substrate, the semiconductor layer having first and second regions;
   forming a gate insulating layer on the semiconductor layer;
   forming a gate electrode on the gate insulating layer on the first region of the semiconductor layer;
   forming source and drain regions by doping impurities into the second region of the semiconductor layer; and
   forming an interlayer insulating layer on the gate electrode and the source and drain regions, the interlayer insulating layer having first and second contact holes exposing the source and drain regions, respectively, wherein forming the first and second contact holes further includes,
      forming a photo-resist on the interlayer insulating layer, the photo-resist having a pattern of the first and second contact holes;
      dry-etching the interlayer insulating layer before the photo-resist pattern hardens;
      then, wet-etching the interlayer insulating layer so as to expose the second region of the semiconductor layer;
      removing the photo-resist pattern.

27. The method according to claim 26, wherein forming the interlayer insulating layer comprises:
   forming a photo resist pattern on the interlayer insulating layer;
   dry etching the interlayer insulating layer partially using the photo resist pattern as a mask; and wet etching the interlayer insulating layer fully, thereby forming the first and second contact holes exposing the source and drain electrodes, respectively.

28. The method according to claim 26, wherein the semiconductor layer is formed by crystallization of amorphous silicon.

29. The method according to claim 26, wherein the interlayer insulating layer and the passivation layer include inorganic insulating material, the interlayer insulating layer including one of silicon oxide ($SiO_2$), silicon nitride (SiNx), tetraethoxysilane (TEOS) and aluminum oxide ($Al_2O_3$).

30. The method according to claim 26, wherein the gate electrode includes conductive metallic material, the conductive metallic material including one of aluminum (Al), chromium (Cr), tungsten (W), molybdenum (Mo), antimony (Sb), tantalum (Ta) and aluminum alloy.

31. The method according to claim 26, wherein the source and drain electrodes include conductive metallic material, the conductive metallic material including one of aluminum (Al), chromium (Cr), tungsten (W), molybdenum (Mo), antimony (Sb), tantalum (Ta) and aluminum alloy.

* * * * *